(12) United States Patent
Kunc et al.

(10) Patent No.: US 8,358,974 B2
(45) Date of Patent: Jan. 22, 2013

(54) METHOD AND CIRCUIT FOR AMPLITUDE MODULATION OF A CARRIER SIGNAL WITH A SPECIFIED MODULATION FACTOR

(75) Inventors: Vinko Kunc, Ljubljana (SI);
Maksimilijan Stiglic, Maribor (SI)

(73) Assignees: Austriamicrosystems AG, Unterpremstaetten (AT); IDS d.o.o., Ljubljana (SI)

( * ) Notice: Subject to any disclaimer, the term of this patent is extended or adjusted under 35 U.S.C. 154(b) by 0 days.

(21) Appl. No.: 13/264,257

(22) PCT Filed: Feb. 23, 2010

(86) PCT No.: PCT/SI2010/000007
§ 371 (c)(1),
(2), (4) Date: Oct. 13, 2011

(87) PCT Pub. No.: WO2010/120252
PCT Pub. Date: Oct. 21, 2010

(65) Prior Publication Data
US 2012/0045022 A1    Feb. 23, 2012

(30) Foreign Application Priority Data

Apr. 14, 2009    (SI) .................... P-200900101

(51) Int. Cl.
*H04B 5/00* (2006.01)
*H04B 7/00* (2006.01)
(52) U.S. Cl. ........................................ 455/41.1; 455/42
(58) Field of Classification Search ................ 455/41.1, 455/41.2, 39, 42; 235/492, 493, 439; 340/5.61, 340/5.64, 10.1, 10.4
See application file for complete search history.

(56) References Cited

U.S. PATENT DOCUMENTS

| | | | | |
|---|---|---|---|---|
| 5,874,725 | A * | 2/1999 | Yamaguchi | 235/492 |
| 6,540,147 | B2 * | 4/2003 | Charrat | 235/492 |
| 6,700,551 | B2 | 3/2004 | Charrat | |
| 7,665,664 | B2 * | 2/2010 | Charrat et al. | 235/451 |
| 2009/0028251 | A1 | 1/2009 | Letemplier | |

FOREIGN PATENT DOCUMENTS

| | | |
|---|---|---|
| EP | 1 717 964 A2 | 11/2006 |
| FR | 2879378 A1 | 6/2006 |
| FR | 2890262 (A1) | 3/2007 |

* cited by examiner

*Primary Examiner* — Sonny Trinh
(74) *Attorney, Agent, or Firm* — Jacobson Holman PLLC

(57) ABSTRACT

An amplitude of a carrier signal at an output of an impedance matching block is measured as a first amplitude value. A value of the signal amplitude at the output of the impedance matching block is calculated as a second amplitude value that a signal resulting from amplitude modulation with said modulation factor from said carrier signal should assume, said carrying signal having an amplitude with the first amplitude value. A setting of a transmitter is changed to decrease the carrier signal amplitude at the output of the impedance matching block. An amplitude of a new carrier signal at the output of the impedance matching block is measured as a new amplitude value. The transmitter setting keeps changing so many times until the new amplitude value is equal to or lower than said second amplitude value or within a predetermined tolerance range around said second amplitude value. Parameters of the last new transmitter setting are stored as the parameters of the transmitter setting, by means of which the transmitter will generate a transmitted signal being amplitude-modulated in the specified manner. The setting of the amplitude modulation with the specified modulation factor is carried out automatically. The designing of the transmitter circuit is simplified.

9 Claims, 1 Drawing Sheet

Figure 1:
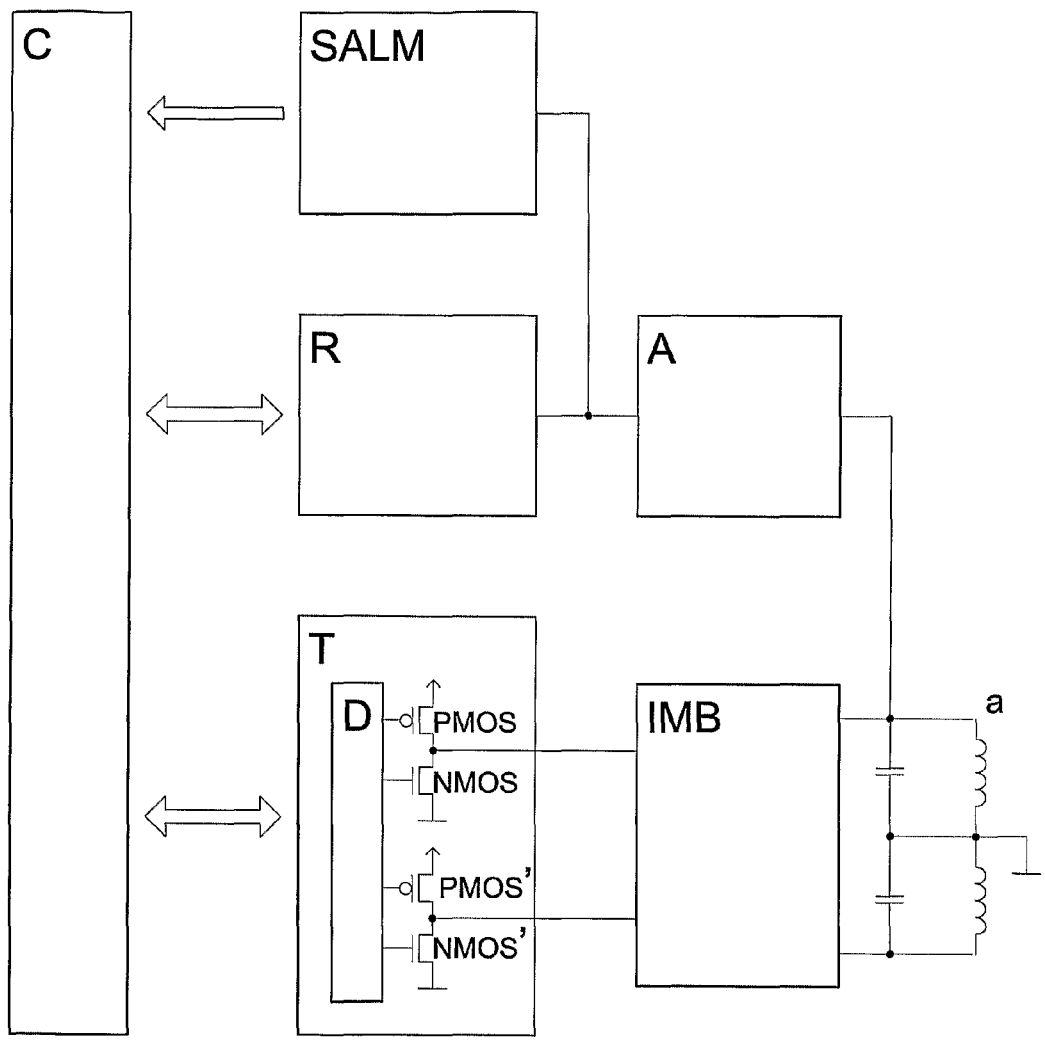

METHOD AND CIRCUIT FOR AMPLITUDE MODULATION OF A CARRIER SIGNAL WITH A SPECIFIED MODULATION FACTOR

This is a national stage of PCT/SI10/000,007 filed Feb. 23, 2010 and published in English, which claims the priority of Slovenia number P-200900101 filed Apr. 14, 2009, hereby incorporated by reference.

The invention relates to a method and a circuit for amplitude modulation of a carrier signal with a specified modulation factor, both being preferably devoted to use in an interrogator of an RFID system, e.g. for communication by means of near field, and allow for an automatic setting of a transmitter to perform said amplitude modulation.

Communication between an interrogator and a transponder within an RFID system is usually effected by means of an amplitude modulated carrier signal.

Since the interrogator supplies the passive transponder with power by means of the carrier signal in the majority of RFID systems, the modulation factor of the amplitude modulated carrier signal must lie within a specified range. Should modulation depth be too shallow, modulation might not be detected. The passive transponder may receive a too low energy flux from the interrogator and can even stop operating, if the modulation depth is too great on the other hand. The similar applies to the communication between two interrogators by means of near field as well (standard ISO 18092).

The modulation factor for individual RFID systems is specified by standards. The RFID system with the carrier signal having a frequency of 13.56 MHz has the modulation factor in the range from 8% to 14% as specified according to a standard ISO 14443 B, in the range from 10% to 30% as specified according to a standard ISO 15693 and in the range from 8% to 30% as specified according to a standard FeliCa™.

The standard ISO 14443B is a specific one due to NRZ coding (non-return-to-zero coding) having time intervals with modulation lasting up to about 100 µs. The passive transponder cannot intercept enough energy flux and store enough of the energy in a capacitor on a chip during the intervals without modulation and must receive power from the modulated carrier signal.

The carrier signal is usually amplitude modulated by an increase in the output impedance of a driver within a transmitter.

Antenna signal amplitude modulation method and circuit are known (U.S. Pat. No. 6,700,551 B2). A control circuit switches binary ports connected in parallel to each other between a state, in which all binary ports have low impedance causing that a nonmodulated carrier signal with a large amplitude is then conducted to an antenna, and a state, in which at least some of the binary ports have high impedance causing that a modulated carrier signal with a lower amplitude is then conducted to the antenna.

Further, an interrogator circuit is known, whose transmitter comprising a driver with a group of PMOS transistors and a group of NMOS transistors—said groups being connected in parallel to each other—is connected to an antenna through an impedance matching block (WO 2006/006104 A1). When all transistors of both groups are switched on and switched off in phase opposition according to half-periods of the carrier signal, the driver generates a nonmodulated carrier signal having a large amplitude. The carrier signal gets amplitude modulated by an increase in the driver output impedance. This is achieved by controlling the PMOS transistors and the NMOS transistors in a way that e.g. only some of the PMOS transistors conduct and all of the NMOS transistors are blocked in the first half-period, yet only some of the PMOS transistors are blocked and all of the NMOS transistors conduct in the second half-period. High transmitter output power is achieved only by the low impedance of the output driver in the range of several ohms, whereas the impedance of the antenna LC circuit has the order of magnitude of several kiloohms. Therefore an impedance of the matching block is inserted therebetween. In a transmitting and receiving circuit of the interrogator, an attenuator is inserted between the antenna LC circuit and the receiver.

An increase in the output impedance of the driver needed in order to conduct an amplitude modulated carrier signal with the specified modulation factor to the antenna is determined either by calculations or empirically when the impedance matching block and the antenna LC circuit are designed.

Such designing is urgently required. Namely, the ratio of the output impedance of the transmitter driver to the amplitude of the carrier signal, when changing from the nonmodulated form to the modulated one and vice versa, does not behave linearly exactly due to the impedance matching block.

The impedance matching block is designed in a way that the output impedance of the transmitter driver and the antenna impedance are matched to one another in time intervals without modulation. But the transmitter driver is obviously not impedance-matched to the antenna anymore in time intervals with modulation when the output impedance of the transmitter driver is increased.

The output impedance of the transmitter driver, which is usually embodied with MOS transistors, depends also on supply voltage. Therefore, the impedance of the matching block and the impedance of the antenna LC circuit are matched to one another only at the nominal supply voltage. Variations in the supply voltage influence the established value of the modulation factor.

The output impedance of the transmitter driver is also a function of values of electronic components parameters. Said parameter values are within the tolerance range, nevertheless their variation strongly influences impedance adjustment as a result of a very high impedance ratio of the impedance matching block, which is even in the range of several orders of magnitude.

In such cases, the output impedance of the transmitter driver and the antenna impedance are not matched to one another even in time intervals without modulation. The value of the established modulation factor does not equal the specified value.

Said designing of the impedance matching block is even more complex for an interrogator, which should support several protocols with different modulation factors.

With respect to the mentioned deficiencies in designing an impedance matching block, when proceeding from the supposedly known output impedance of a transmitter and the known impedance of an antenna LC circuit, the technical problem of the present invention is to propose a method and a circuit for an automatic setting of a transmitter parameter in order to establish a specified modulation factor for the existing transmitter, the existing impedance matching block and the existing antenna LC circuit.

Said technical problem is solved by a method of the invention for an amplitude modulation of a carrier signal with a specified modulation factor as characterized by features of the characterizing portion of the first claim and by a circuit of the invention for carrying out said method as characterized by features of the characterizing portion of the sixth claim, the variants of their embodiments being characterized by dependent claims.

According to the invention, a setting of the amplitude modulation of the carrier signal with a specified modulation factor is automatically carried out in an RFID interrogator. The setting is effected for the existing interrogator circuit made of electronic components, whose actual parameter values may also depart from nominal ones, for which the impedance matching block was designed. Consequently, the accuracy of the amplitude modulation is enhanced on the one hand and the designing of the interrogator circuit simplified on the other.

Figure 2:
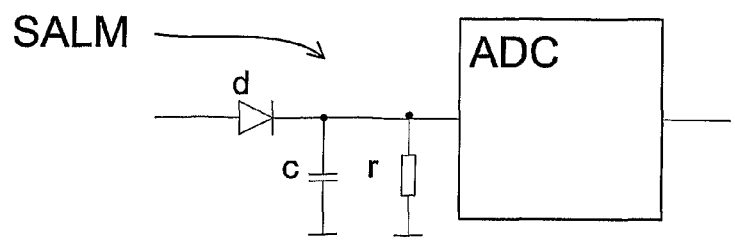

The invention will now be explained in more detail by way of the description of embodiments of the method of the invention for amplitude modulation of a carrier signal with a specified modulation factor and of the circuit of the invention for carrying out said method and with reference to the accompanying drawings representing in:

FIG. 1 a block diagram of a transmitting and receiving circuit in a RFID interrogator, said circuit being improved by the invention to carry out amplitude modulation with a specified modulation factor, and FIG. 2 a circuit of a proposed signal amplitude-level meter.

A method and a circuit as proposed by the invention for amplitude modulation of a carrier signal with a specified modulation factor is mainly intended to be used in a transmitting and receiving circuit of an RFID interrogator. A block diagram of such RFID interrogator is represented in FIG. 1. A controller C controls a driver D in a transmitter T. The driver D drives transistors PMOS, NMOS, PMOS', NMOS', which can be controlled individually. A digital carrier signal or a modulated carrier signal from the output of the transmitter T is conducted through an impedance matching block IMB to a connecting terminal of a transmitting and receiving antenna a. An antenna LC circuit, mainly suited for communicating by means of near field, is represented. On the other hand, the connecting terminal of the transmitting and receiving antenna a is connected, usually through an attenuator A, to a receiver R connected to a controller C.

The amplitude modulation of the carrier signal with the specified modulation factor is improved by the invention in the following way. A method of the invention comprising the steps described below is carried out each time before communication starts or after the supply voltage or the transistor gate voltage has changed.

An amplitude of said carrier signal at the output of the impedance matching block IMB is measured. It is stored as a first amplitude value.

A value of the signal amplitude that a signal resulting from amplitude modulation with said modulation factor from said carrier signal should assume at the output of the impedance matching block IMB is calculated, said carrying signal having the amplitude with the first amplitude value. Said calculated amplitude value is stored as a second amplitude value.

A setting of the transmitter T is changed in a way that the carrier signal amplitude at the output of the impedance matching block is decreased.

The amplitude of a new carrier signal at the output of the impedance matching block IMB is measured. The new amplitude value is compared to said second amplitude value.

The setting of the transmitter T should keep changing so many times until the new amplitude value is equal to or lower than said second amplitude value or within a predetermined tolerance range around said second amplitude value.

Lastly, parameters of the last new transmitter setting are stored as the parameters of the transmitter setting, by means of which the transmitter will generate a transmitted signal being amplitude-modulated in the specified manner, i.e. with the specified modulation factor.

Two following variant embodiments are proposed with respect to a way of changing that parameter of the setting of the transmitter T, by means of which the setting of the transmitter T is changed in the method of the invention.

The parameter of the setting of the transmitter T, by means of which the transmitter setting is changed, is changed monotonously.

The parameter of the setting of the transmitter T, by means of which the transmitter setting is changed, is changed according to a method of successive approximations.

The output impedance of a driver D within the transmitter T is proposed as the parameter of the setting of the transmitter T, by means of which the setting of the transmitter T is changed. In this connection, the number of the driving transistors or the output resistance may be changed.

Yet the amplitude of said carrier signal at the output of the impedance matching block IMB may be attenuated first and the attenuated amplitude is measured as the first amplitude value in said first step of the method and then as the new amplitude value. Such new amplitude value is compared to an amplitude value, which equals the second amplitude value reduced by the attenuation factor.

The method of the invention allows for the automatic setting of the amplitude modulation of the carrier signal with the specified modulation factor in the RFID interrogators.

A transmitting and receiving circuit of the RFID interrogator is improved by the invention in the following way (FIG. 1).

An input of a signal amplitude-level meter SALM is connected to a common terminal of an output of the impedance matching block IMB and of the antenna a. An output of the signal amplitude-level meter SALM is connected to the input of the controller C.

According the invention, the controller C is equipped in a way that it calculates the value of the signal amplitude at the output of the impedance matching block IMB as a second amplitude value that a signal resulting from amplitude modulation with said modulation factor from said carrier signal should assume, said carrying signal having measured amplitude;

it changes a setting of the transmitter T in a way that the carrier signal amplitude at the output of the transmitter T is decreased;

it keeps changing the setting of the transmitter T so many times until the new amplitude value of the carrier signal is equal to or lower than said second amplitude value or within a predetermined tolerance range around said second amplitude value;

it stores parameters of the last new transmitter setting as the parameters of the transmitter setting, by means of which the transmitter T will generate a transmitted signal being amplitude-modulated in the specified manner.

The following two variant embodiments of the signal amplitude-level meter SALM are proposed.

Within the signal amplitude-level meter SALM a rectifier diode d and an analogue-to-digital converter ADC are series-connected (FIG. 2). The output terminal of the rectifier diode d is mass connected via paralleled capacitor c and resistor r.

The signal amplitude-level meter SALM is a mixing circuit.

A variant embodiment, according to which an attenuator A is inserted between the output of the impedance matching block IMB and the input of the signal amplitude-level meter SALM is proposed as well. The attenuated new amplitude value is now compared to the second amplitude value reduced by the attenuation factor of the attenuator A.

The invention claimed is:

1. A method for amplitude modulation of a carrier signal with a specified modulation factor,
   according to which method a digital carrier signal is conducted from a transmitter output through an impedance matching block to a connecting terminal of an antenna, characterized in
   that an amplitude of said carrier signal at the output of the impedance matching block is measured as a first amplitude value,
   that a value of the signal amplitude at the output of the impedance matching block is calculated as a second amplitude value,
   which should be assumed in a modulated low-level carrier signal section by the signal resulting from amplitude modulation with said modulation factor from said carrier signal having an amplitude equal to the first amplitude value,
   that a transmitter setting is changed to decrease the carrier signal amplitude at the output of the impedance matching block,
   that an amplitude of a new carrier signal at the output of the impedance matching block is measured as a new amplitude value,
   that the transmitter setting keeps changing so many times until the new amplitude value is equal to or lower than said second amplitude value or is within a predetermined tolerance range around said second amplitude value
   and that parameters of the last new transmitter setting are stored as the parameters of the transmitter setting in the modulated low-level carrier signal sections for transmitting a signal being amplitude-modulated in the specified manner.

2. The method as recited in claim 1, characterized in that the parameter of the transmitter setting, by means of which the transmitter setting is changed, is changed monotonously.

3. The method as recited in claim 1, characterized in that the parameter of the transmitter setting, by means of which the transmitter setting is changed, is changed according to a method of successive approximations.

4. The method as recited in claim 1, characterized in that the output impedance of a driver within the transmitter is the parameter of the transmitter setting, by means of which the transmitter setting is changed.

5. The method as recited in claim 1, characterized in that the amplitude of said carrier signal at the output of the impedance matching block is attenuated and the attenuated amplitude is measured as the first amplitude value and the new amplitude value as well and that such new amplitude value is compared to the second amplitude value reduced by the attenuation factor.

6. A circuit for amplitude modulation of a carrier signal with a specified modulation factor, in which circuit a digital carrier signal is conducted from an output of a transmitter (T) controlled by a controller (C) through an impedance matching block (IMB) to a connecting terminal of an antenna (a), characterized in
   that an input of a signal amplitude-level meter (SALM) is connected to a common terminal of the output of the impedance matching block (IMB) and of the antenna (a),
   that an output of the signal amplitude-level meter (SALM) is connected to an input of the controller (C)
   and that the controller (C)
      calculates the value of the signal amplitude at the output of the impedance matching block IMB as a second amplitude value that a signal resulting from amplitude modulation with said modulation factor from said carrier signal should assume in a modulated low-level carrier signal section, said carrying signal having measured amplitude,
      changes a setting of the transmitter (T) to lower the carrier signal amplitude at the output of the transmitter (T),
      keeps changing the setting of the transmitter (T) so many times until the new amplitude value of the carrier signal is equal to or lower than said second amplitude value or within a predetermined tolerance range around said second amplitude value,
      stores parameters of the last changed setting of the transmitter (T) as the parameters of the transmitter setting in the modulated low-level carrier signal sections for transmitting a signal being amplitude-modulated in the specified manner.

7. The circuit as recited in claim 6, characterized in that, within the signal amplitude-level meter (SALM), a rectifier diode (d), an output terminal of which is mass connected through paralleled capacitor (c) and resistor (r), and an analogue-to-digital converter (ADC) are series-connected.

8. The circuit as recited in claim 6, characterized in that the signal amplitude-level meter (SALM) is a mixing circuit.

9. The circuit as recited in claim 6, characterized in that an attenuator (A) is inserted between the output of the impedance matching block (IMB) and the input of the signal amplitude-level meter (SALM) and that the attenuated new amplitude value is compared to the second amplitude value reduced by the attenuation factor of the attenuator (A).

* * * * *